United States Patent [19]

Wagner

[11] Patent Number: 4,471,325
[45] Date of Patent: Sep. 11, 1984

[54] POWER COMBINER WITH REENTRANT COAXIAL DIODE OSCILLATORS

[75] Inventor: Linda C. Wagner, Tewksbury, Mass.

[73] Assignee: Raytheon Company, Lexington, Mass.

[21] Appl. No.: 399,564

[22] Filed: Jul. 19, 1982

[51] Int. Cl.³ .............................................. H03B 7/14
[52] U.S. Cl. ...................................... 331/56; 331/101; 331/107 P; 331/107 C
[58] Field of Search ................. 331/56, 107 P, 107 C, 331/96, 101, 102

[56] References Cited

U.S. PATENT DOCUMENTS

| | | | |
|---|---|---|---|
| 3,931,587 | 1/1976 | Harp et al. | 331/56 |
| 4,097,823 | 6/1978 | Jerinic et al. | 332/9 R |
| 4,172,240 | 10/1979 | Jerinic | 331/56 |
| 4,189,684 | 2/1980 | Hieber et al. | 331/56 |

*Primary Examiner*—Siegfried H. Grimm
*Attorney, Agent, or Firm*—Philip J. McFarland; Joseph D. Pannone

[57] ABSTRACT

An improved combiner of microwave power out of a plurality of coaxial diode oscillators is shown to be made up of a circular cylindrical cavity dimensioned to operate in the $TM_{020}$ mode at a selected microwave frequency, with such oscillators being disposed about the periphery of both end planes of such cavity and each individual one of such oscillators being reentrant at an angle of 180° so as to double the number of such oscillators as compared with the number of straight coaxial diode oscillators that may be disposed about the periphery of such cavity.

2 Claims, 3 Drawing Figures

4,471,325

POWER COMBINER WITH REENTRANT COAXIAL DIODE OSCILLATORS

The Government has rights in this invention pursuant to Contract No. F33615-80-C-1015 awarded by the Department of the Air Force.

BACKGROUND OF THE INVENTION

This invention pertains generally to circularly cylindrical cavity power combiners for combining the power output of a plurality of diode oscillators and, in particular, to a combiner of such type wherein the number of diode oscillators combined may be doubled without increasing the outer diameter of the combiner.

It is known in the art (U.S. Pat. No. 3,931,587) that a microwave power source may be formed by providing a cylindrical cavity operating in the $TM_{010}$ mode to combine the outputs of a plurality of coaxial diode oscillators. In such a source, coaxial diode oscillators are symmetrically disposed on the periphery of the cylindrical cavity. The number of coaxial diode oscillators which may be so disposed is limited by the length of such periphery with the result that the amount of microwave power out of such a combiner is similarly limited.

It is also known in the art (see U.S. Pat. No. 4,172,240) that the number of coaxial diode oscillators in a microwave power source may be doubled by positioning the coaxial diode oscillators in axially oriented holes around the periphery of both the top and bottom sections of a cylindrical cavity operating in the $TM_{010}$ mode, with the associated stabilizing loads extending through radially oriented holes in the side walls of both the top and bottom sections of such cavity. Although the number of coaxial diode oscillators combined in a single cavity may be increased in this manner, extending the stabilizing loads radially outward from the cavity substantially increases the size of the combiner. If the combiner is to be utilized in a solid state transmitter for an active missile seeker, such increased size is obviously undesirable.

It is also known in the art (see U.S. Pat. No. 4,189,684) that the number of coaxial diode oscillators that may be combined in a single cavity combiner may be increased by increasing the length of the periphery of a cylindrical cavity to support the $TM_{020}$ mode and by suppressing higher order modes.

SUMMARY OF THE INVENTION

With this background of the invention in mind, it is a primary object of this invention to provide an improved power combiner for combining coaxial diode oscillators wherein the number of such diode oscillators may be doubled without increasing the outer diameter of the combiner.

It is another object of this invention to provide an improved power combiner for combining coaxial diode oscillators having improved coupling between the diode oscillators and the combiner cavity.

The foregoing and other objects of this invention are generally attained by providing a $TM_{020}$ mode circular cylindrical cavity power combiner wherein IMPATT diodes are housed in a first ring of holes around the periphery of the top and bottom of the cavity. The associated diode oscillator stabilizing loads are disposed within a second ring of holes concentric with the first ring and on a smaller radius with respect to the cavity center. The coaxial line in each coaxial diode oscillator is bent by 180° intermediate the IMPATT diode and stabilizing load.

BRIEF DESCRIPTION OF THE DRAWINGS

Other objects and many of the attendant advantages of the invention will be readily appreciated as the same becomes better understood by reference to the following detailed description when considered in connection with the accompanying drawings wherein.

DESCRIPTION OF THE PREFERRED EMBODIMENT

Before proceeding with a detailed description of the FIGURES it is noted here in passing that, for the sake of simplicity, only four diode oscillators necessary to an understanding of the invention have been illustrated. Further, ancillary elements, such as mounting hardware, power supplies for the coaxial diode oscillators and connections to an output load are not shown. It is felt that such unillustrated elements may be easily provided by one of ordinary skill in the art and need not here be shown or explained.

Figure 1:
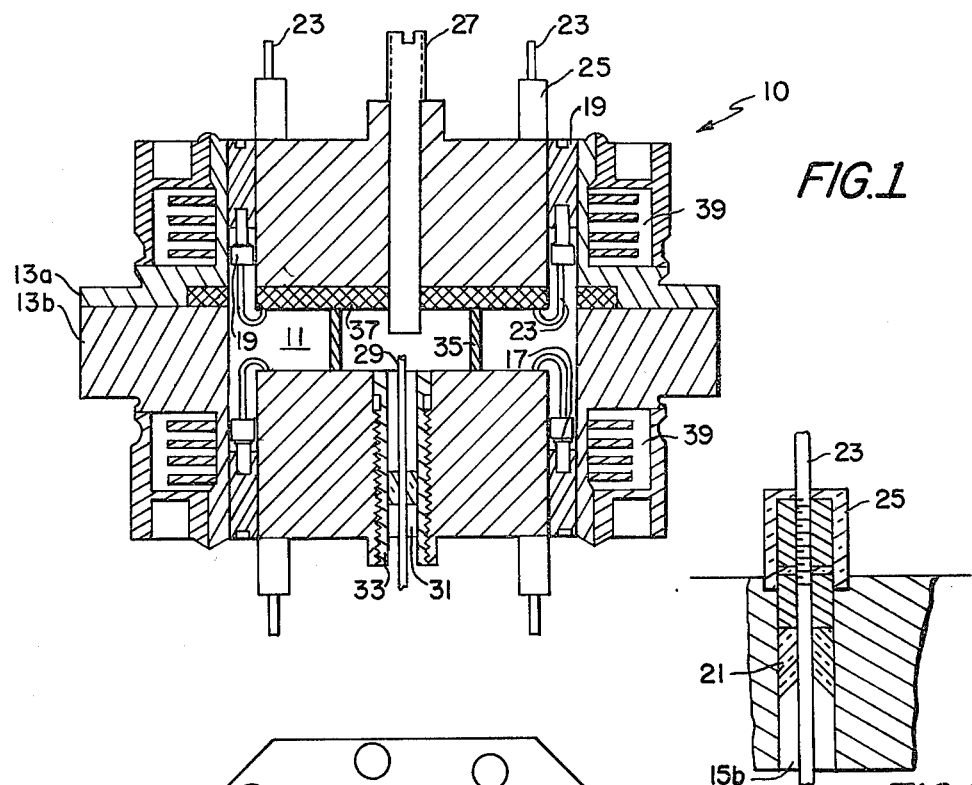
FIG. 1 is a cross-sectional view, somewhat simplified, of a microwave power combiner according to the invention.
Figure 3:
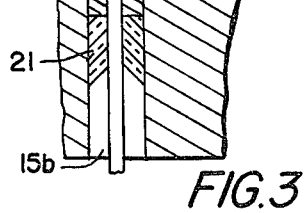
FIG. 3 is a sketch illustrating the disposition of one of the stabilizing loads in the combiner of FIG. 2.
Figure 2:
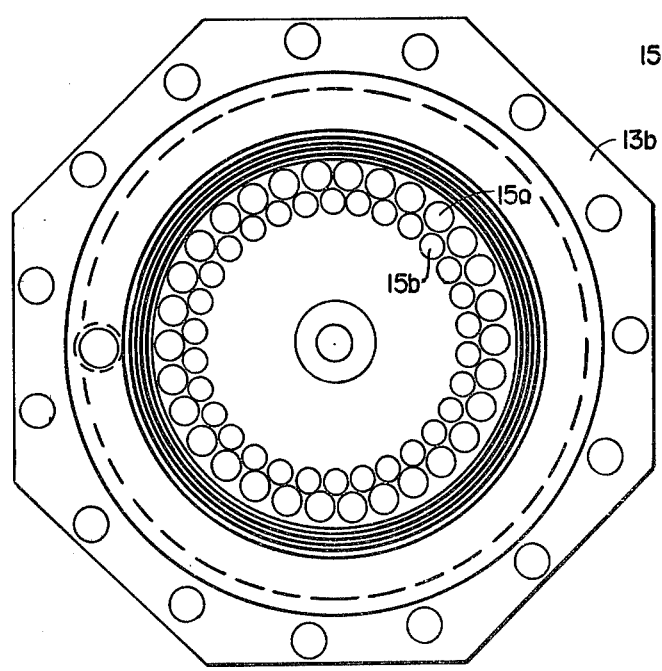
FIG. 2 is a plan view of the bottom half of a microwave power combiner according to this invention.

Referring now to FIGS. 1, 2 and 3, the preferred form of a microwave power combiner 10 is shown to include a cavity 11 defined by metallic plates 13a, 13b, such cavity being dimensioned to support the $TM_{020}$ mode at the desired operating frequency. The cavity 11 is effective to combine the power output from a plurality of coaxial diode oscillators (not numbered). Each one of such oscillators is formed by boring a pair of holes such as the holes marked 15a, 15b to form the outer conductor of a diode oscillator circuit. Hole 15a, which contains the IMPATT diode 17 and the requisite impedance matching transformer 19, is disposed near the periphery of the cavity 11. Hole 15b, which contains a stabilizing load 21, is at a smaller radius with respect to the center of the cavity 11 than hole 15a. It should also be noted that the centers of holes 15a, 15b are offset from one another to provide the greatest possible packing density but need not be for maximum coupling. A center conductor 23, having a U-shaped or 180° bend as shown in FIG. 1, is disposed between holes 15a and 15b. An insulating sleeve 25 (FIG. 3) is provided behind the stabilizing load 21 (FIG. 3) to insulate the center conductor 23.

A tuning plug 27 and a probe 29 are adjustably mounted as shown to project into the center of the cavity 11. The probe 29 is a length of the center conductor of a coaxial cable. A dielectric sleeve 31 and a metallic shield 33 threaded as shown in the metallic plate 13b complete the probe 29. The exterior portion (not shown) of the probe 29 includes a coaxial connector (not shown) to allow connection to a load (also not shown). The tuning plug 27 is threaded in the metallic plate 13a to permit adjustment of the distance to which such plug may be inserted into the cavity 11, thereby to adjust the resonant frequency of such cavity.

A dielectric annulus 35, here made of alumina, is positioned as shown within the cavity 11. The annulus 35 is effective to shift the frequencies of undesired higher order modes (such as the $TM_{210}$ and the $TM_{110}$)

away from the frequency of the $TM_{020}$ mode. To further suppress undesired higher order modes within the cavity 11, a plate 37 containing slits filled with radio frequency absorbing material is disposed as shown in the cavity 11. Such absorbing material may here be that known as "Eccosorb" manufactured by the Emerson-Cummings Company, Canton, Mass.

As mentioned hereinabove, the coaxial center conductor 23 is bent within the cavity 11 so that the coupling between each coaxial diode oscillator (not numbered) and the cavity 11 is increased and the coupling to the stabilizing load 21 is decreased. Because the stabilizing load 21 is the greater source of loss within the microwave power combiner 10, decreased coupling between the cavity 11 and the stabilizing load 21 results in improved combining efficiency. Completing the combiner 10 are cooling channels 39 provided in metallic plates 13a, 13b adjacent the IMPATT diode 17. Fluid pumped in a conventional manner through channels 39 then reduces heating of the IMPATT diode 17 during operation.

Having described a preferred embodiment of this invention, it will now be apparent to one of skill in the art that changes may be made without departing from the inventive concept of providing coaxial diode oscillators reentrant at an angle of 180° around the periphery of a circularly cylindrical cavity. For example, the mode of operation of such cavity or the number of coaxial diode oscillators may be changed. It is felt, therefore, that this invention should not be restricted to its disclosed embodiment, but rather should be limited by the spirit and scope of the following claims.

What is claimed is:

1. A combiner for microwave power produced by coaxial diode oscillators, such combiner comprising:
   (a) a first and a second electrically conductive shaped member abutting one the other to define a circular cylindrical cavity; and
   (b) means for mounting a first plurality of coaxial diode oscillators on the first electrically conductive shaped member and a second like plurality of coaxial diode oscillators on the second electrically conductive shaped member, the ends of each such oscillator being adjacent to one another and the center conductor of each such oscillator being shaped to form a 180° loop adjacent to the periphery of the circular cylindrical cavity.

2. A combiner as in claim 1 wherein the circular cylindrical cavity is dimensioned to support the $TM_{020}$ mode at the resonant frequency of such cavity and mode suppression means are disposed within such cavity.

* * * * *